United States Patent
Hughes et al.

(10) Patent No.: US 8,461,839 B2
(45) Date of Patent: Jun. 11, 2013

(54) MAGNETIC RESONANCE CONTROL SYSTEM, METHOD AND APPARATUS FOR PRODUCING A 2D MR IMAGE

(75) Inventors: Timothy Hughes, Erlangen (DE); Tallal Charles Mamisch, Zurich (CH)

(73) Assignees: Siemens Aktiengesellschaft, Munich (DE); Inselspital-Stiftung, Bern (CH)

( * ) Notice: Subject to any disclaimer, the term of this patent is extended or adjusted under 35 U.S.C. 154(b) by 572 days.

(21) Appl. No.: 12/704,688

(22) Filed: Feb. 12, 2010

(65) Prior Publication Data

US 2010/0207627 A1   Aug. 19, 2010

(30) Foreign Application Priority Data

Feb. 13, 2009   (DE) .................. 10 2009 008 796

(51) Int. Cl.
    *G01V 3/00*   (2006.01)
(52) U.S. Cl.
    USPC .................................... 324/309; 382/131
(58) Field of Classification Search
    USPC ............... 324/309, 307, 306, 300; 382/131
    See application file for complete search history.

(56) References Cited

U.S. PATENT DOCUMENTS

| | | | |
|---|---|---|---|
| 4,674,046 A * | 6/1987 | Ozeki et al. ................. | 382/131 |
| 5,810,729 A | 9/1998 | Hushek et al. | |
| 7,548,638 B2 | 6/2009 | Graessner | |
| 7,715,899 B2 * | 5/2010 | Harvey et al. ................ | 600/410 |
| 8,155,417 B2 * | 4/2012 | Piron et al. .................. | 382/131 |
| 2006/0050945 A1 | 3/2006 | Lehtonen-Krause | |
| 2008/0039711 A1 | 2/2008 | Feilkas et al. | |

FOREIGN PATENT DOCUMENTS

JP   2008148932   7/2008

OTHER PUBLICATIONS

"On-Line Automatic Slice Positioning for Brain MR Imaging," van der Kouwe, et al., NeuroImage, vol. 27 (2005) pp. 222-230.

* cited by examiner

*Primary Examiner* — Louis Arana
(74) *Attorney, Agent, or Firm* — Schiff Hardin LLP (57) ABSTRACT

In a method and control system for producing two-dimensional diagnostic MR images using a magnetic resonance imaging scanner, a first three-dimensional MR image data set of a predetermined region within a body is produced using the magnetic resonance imaging scanner with an initial resolution. A second three-dimensional MR image data set of the predetermined region with a second resolution is then produced using the magnetic resonance imaging scanner, the second resolution being higher than the first resolution. Using the first three-dimensional MR image data set, layers are determined for the diagnostic two-dimensional MR images to be produced. The two-dimensional MR images are then computed from the second MR image data set for these layers automatically.

19 Claims, 5 Drawing Sheets

MAGNETIC RESONANCE CONTROL SYSTEM, METHOD AND APPARATUS FOR PRODUCING A 2D MR IMAGE

BACKGROUND OF THE INVENTION

1. Field of the Invention

The present invention concerns a method and a control system for producing one or more two-dimensional MR images using a magnetic resonance imaging scanner. Furthermore, the present invention concerns a magnetic resonance imaging apparatus for implementing such a method.

2. Description of the Prior Art

With image processing for orthopedic purposes, the aim is to simplify and improve the diagnostic process, and thereby also accelerate the associated work flow in an examination. Conventionally, in an orthopedic examination, images of a joint are made in different planes in order to be able to make a necessary diagnosis. As an example, in an examination of a knee joint, images are necessary in one plane for the meniscus, in one plane for the cartilage, and in various planes for the various ligaments in the knee region. With the conventional procedure, whereby the planes or layers necessary for the examination are determined based on two-dimensional images, the production of the necessary images for examining a knee joint is extremely time consuming. Furthermore, there is the problem, with a subsequent examination of the same knee joint, of determining the same planes in order to obtain reproducible or comparable results. These problems presently restrict the diagnostic results and limit the efficiency in clinical applications.

The following describes the procedure for such examinations according to the present state of technology.

The joint to be examined is first localized using images of lower resolution. Subsequently, two-dimensional images of a higher resolution are produced, in order to plan out which two-dimensional MR images are necessary for the actual diagnosis. For this purpose, three different perspectives of the joint are imaged by the higher resolution two-dimensional images. These perspectives are planned using the lower resolution images taking the anatomical data into account, so the resulting perspectives generally correspond to the sagittal, coronal, and transversal planes.

In other words, the layers for the necessary two-dimensional MR images are planned out using two-dimensional images. Normally, this results in the MR images necessary for the diagnosis being produced in layers which lie in the sagittal, coronal, or axial planes. The structures, however, that must be examined for an exact diagnosis of the meniscus or cruciate ligament in the knee, for example, do not lie in the sagittal, coronal, or axial plane, but rather, run at an angle to these planes. Furthermore, there are patient dependent anatomical differences, which require the production of the two-dimensional MR images to be tailored to the individual patient. In summary, the two-dimensional MR images produced according to the present state of technology seldom contain the information necessary for an exact diagnosis.

This problem is approached according to the present state of technology, by the patient which is to be examined being placed in a standardized position, and the planning of the layers, so the necessary MR images will be produced based on the experience of the attending technician. The anatomical differences between different patients set tight limits for the process used according to the present state of technology however, such that the resulting diagnosis based on MR images produced in this manner is, to some extent, inexact. Furthermore, reproducibility of the MR images is difficult to achieve, particularly when the MR images which are to be compared are produced by different operators (e.g. doctors).

A further problem, in accordance with the state of technology, is that production of a higher resolution MR image can first commence when the layer is determined in which the MR image is to be recorded. This means that the work flow, with the present state of technology, is sequential for the most part, and a quality check may first be made after the MR image has been produced. This leads to either only limited diagnosis on the basis of the MR images, or repeated planning and production of the MR images, so the examination period is extended for the patient and the doctor.

SUMMARY OF THE INVENTION

An object of the present invention is to provide two-dimensional MR images for examining a specific region (e.g. a joint) within the body of a patient such that the problems existing with the present state of technology are at least partially alleviated.

This object is achieved in accordance with the present invention by a method for producing one or more two-dimensional MR images using a magnetic resonance imaging scanner that includes the following steps.

Using the magnetic resonance imaging scanner, a first three-dimensional MR image data set of a predetermined region within the body of a patient is produced. This first three-dimensional MR image data set has thereby a first resolution.

Using the magnetic resonance imaging scanner, a second three-dimensional MR image data set of the predetermined region is produced. In this case, this second three-dimensional MR image data set is produced with a second resolution, which is higher than the first resolution.

For the two-dimensional MR image or for the two-dimensional MR images to be produced, one or more layers (normally one layer per two-dimensional image to be produced) are selected or planned for based on the first three-dimensional MR image data set.

Each of the two-dimensional MR images to be produced for this two-dimensional MR image within the selected or planned for layer is then automatically computed from the second three-dimensional MR image data set.

While the second three-dimensional MR image data set with the higher resolution is being produced, the respective operator can select or plan out the necessary layers using the first three-dimensional MR image data set to be used for the examination of the specific region, such as a knee joint, whereby features or characteristics for localization, or as a definition of these initially selected layers, are stored. Because the work is being carried out on a three-dimensional data set, the operator has complete flexibility or freedom in selecting the necessary layers, which provides for a direct quality control of the relevant planned out two-dimensional layers in regard to the diagnosis which is to take place. When the second three-dimensional MR image data set with the higher resolution is produced, the layers selected and saved by the operator are used to reformat the data produced from the second three-dimensional MR image data set, so that the two-dimensional MR images with a higher resolution for the layers planned out in this manner may be produced thereby. Using these two-dimensional MR images, which can also be archived and shared, a precise diagnosis can be carried out.

The second three-dimensional MR image data set may be produced, in accordance with the invention, with a sampling procedure ("scan") or with several scans. In this manner, specific sections of the predetermined region, or the entire predetermined region as well, can also be scanned numerous times (for example, using different contrasts or different sampling characteristics).

The process in accordance with the invention can be used to particular advantage when the selection of the one or more layers for the two-dimensional image(s) to be produced and the production of the second three-dimensional MR image data set are carried out simultaneously.

Because the selection of the layers and the production of the second three-dimensional MR image data set are carried out simultaneously, a significant amount of time may be saved in comparison with the present state of technology. This is explained in that with the present state of technology the selection of the layers and the production of the two-dimensional MR images for these layers is carried out consecutively. Because the typical production of two-dimensional MR images using a magnetic resonance imaging scanner takes significantly longer than the production of two-dimensional MR images based on an existing three-dimensional MR image data set, the above mentioned time saving is explained.

In an embodiment of the invention, an MRI examination using the magnetic resonance imaging scanner will be planned out with the use of the first three-dimensional MR image data set, so with this MRI examination, certain MR aspects of a region (e.g. a layer) within the predetermined region will be automatically determined.

The specific MR aspects include thereby at least one aspect that is selected from the following group:
the T1 time,
the T2 time,
the T2* time, and
the diffusion constant of certain substances within the region.

By establishing these MR aspects, the biochemical construction of the tissue within the examined region can be extrapolated, whereby subsequently a disease or deterioration within the tissue may be detected.

With the present invention, the resolution of the first three-dimensional MR image data set and/or the resolution of the second three-dimensional MR image data set can be, for the most part, identical in all perspectives.

When the resolution of the second three-dimensional MR image data set is identical in all perspectives (i.e. the resolution is isotropic and is, e.g. 0.5 mm), then the resolution of the two-dimensional MR images to be produced from the second three-dimensional MR image data set is advantageously independent, for the most part, of the alignment or orientation of the respective selected layer, which is portrayed by the respective two-dimensional MR image.

In accordance with one design version of the invention, the layer or layers for the two-dimensional MR images to be produced is/are determined automatically from the first three-dimensional MR image data set. For this, a given anatomical orientation point, such as a meniscus or a ligament, is localized automatically in the first three-dimensional MR image data set, and the layer(s) is/are determined independently of the localized orientation point. In this case, the "orientation point" is not to be understood as a "point," but rather as a guide for determining the layer(s). When a meniscus is given as an orientation point, or, rather, a guide, the process in accordance with the invention localizes, for example using pattern recognition, a meniscus within the first three-dimensional MR image data set, and computes, for example from the location of said meniscus within the predetermined region, the layers necessary for producing the two-dimensional MR images.

With this design version in accordance with the invention, the necessary layers are determined practically without the aid of a human operator. Naturally, it is possible, in accordance with the invention, for an operator to execute a type of quality check of the automatically determined layers, and in the case that the quality is not sufficient, to manually modify the process.

The above object also is achieved in accordance with the present invention by a control system for a magnetic resonance imaging scanner for producing one or more two-dimensional MR images. The control system has a control unit for operating the magnetic resonance imaging scanner, a receiving device for receiving the MR data recorded by the magnetic resonance imaging scanner of a region within the body of a patient, and an evaluation device for evaluating the MR data recorded in such a manner. The control system is designed such that the device controls the magnetic resonance imaging scanner through the control device, so that the magnetic resonance imaging scanner produces a first three-dimensional MR image data set of the predetermined region and a second three-dimensional MR image data set of the predetermined region. The second three-dimensional MR image data set thus has a higher resolution than that of the first three-dimensional MR image data set. Using the device, one or more layers are selected for producing the one or more two-dimensional MR images based on the first three-dimensional MR image data set. Furthermore, the device computes the two-dimensional MR images within the layer(s) from the second MR image data set.

The advantages of the control system in accordance with the invention are application to the method process in accordance with the invention, and therefore need not be repeated.

Furthermore, the present invention includes a magnetic resonance imaging apparatus that contains a control system in accordance with the invention.

The present invention also encompasses an electronically readable data medium, e.g. a DVD, a magnetic tape or a USB stick, on which electronically readable control information (programming instructions), particularly the software (see above) is stored (encoded). When this control information (software) is read from the data medium, and stored on a controller or computer of a magnetic resonance imaging apparatus, then all design versions of the previously described method of the invention can be executed.

The programming instructions, e.g. data bases and auxiliary functions in order to implement the relevant design versions of the method are in the form of software that can execute the process of one of the design versions described above. This can be a source code (e.g. C++) which is not compiled and attached or need only be interpreted, or an executable software code, which need only be installed in the respective computer in order to run.

The present invention is particularly suited to producing two-dimensional MR images, which are to be recorded in a layer which is at an angle to sagittal, coronal or transversal planes for the purpose of making an orthopedic diagnosis in order, for example, to determine the condition of a knee joint. It is understood that the present invention is not limited to this preferred field of use, as firstly, two-dimensional MR images for layers parallel to sagittal, coronal or transversal planes may also be produced with the present invention, and secondly, the present invention may also be used for purposes other than orthopedic diagnosis.

DESCRIPTION OF THE PREFERRED EMBODIMENTS

Figure 1:
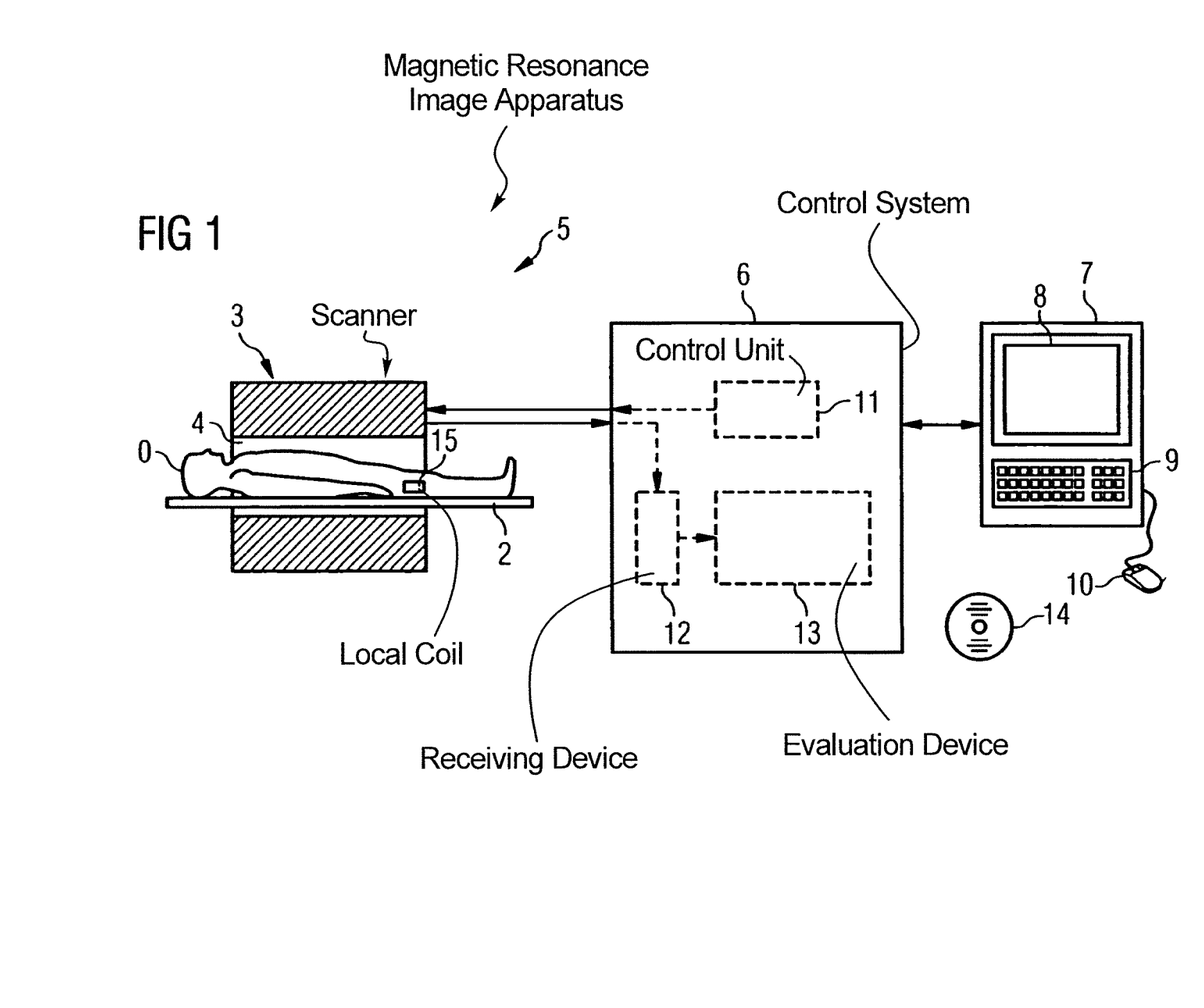
FIG. 1 illustrates a magnetic resonance imaging apparatus in accordance with the invention with a control system in accordance with the invention.

FIG. 1 shows a schematic diagram of a magnetic resonance imaging apparatus 5. The magnetic resonance imaging apparatus 5 includes a scanner 3, which generates the magnetic field required for the MRI examination in a scanning region 4, a table 2, a control system 6, which controls the scanner 3 and captures MR data from the scanner 3 and a terminal 7 connected to the control system 6.

The control system 6 contains a control unit 11, a receiving device 12 and an evaluation device 13. During an MRI examination, MR data is captured by the receiving device 12 from the scanner 3, and the scanner 3 is controlled by the control unit 11 such that the MR data is captured in a local coil 15, which is located on the body of a patient 0 lying on the table 2.

The evaluation device 13 processes the MR data in such a manner that it can be graphically displayed on a monitor 8 of the terminal 7, which contains not only the monitor 8, but also a keyboard 9 and a mouse 10, so a layer may be planned by an operator, and further guidelines for executing the process of the invention may be entered. The software for the control device 6 may also be installed through the terminal 7 in the control system 6, particularly in the evaluation device 13. This software for the control system 6 contains the method in accordance with the invention for producing two-dimensional MR images as well, and can also be stored on a DVD 14, so that this software may be read from the DVD 14 by the terminal 7 and copied into the control system 6.

Figure 2:
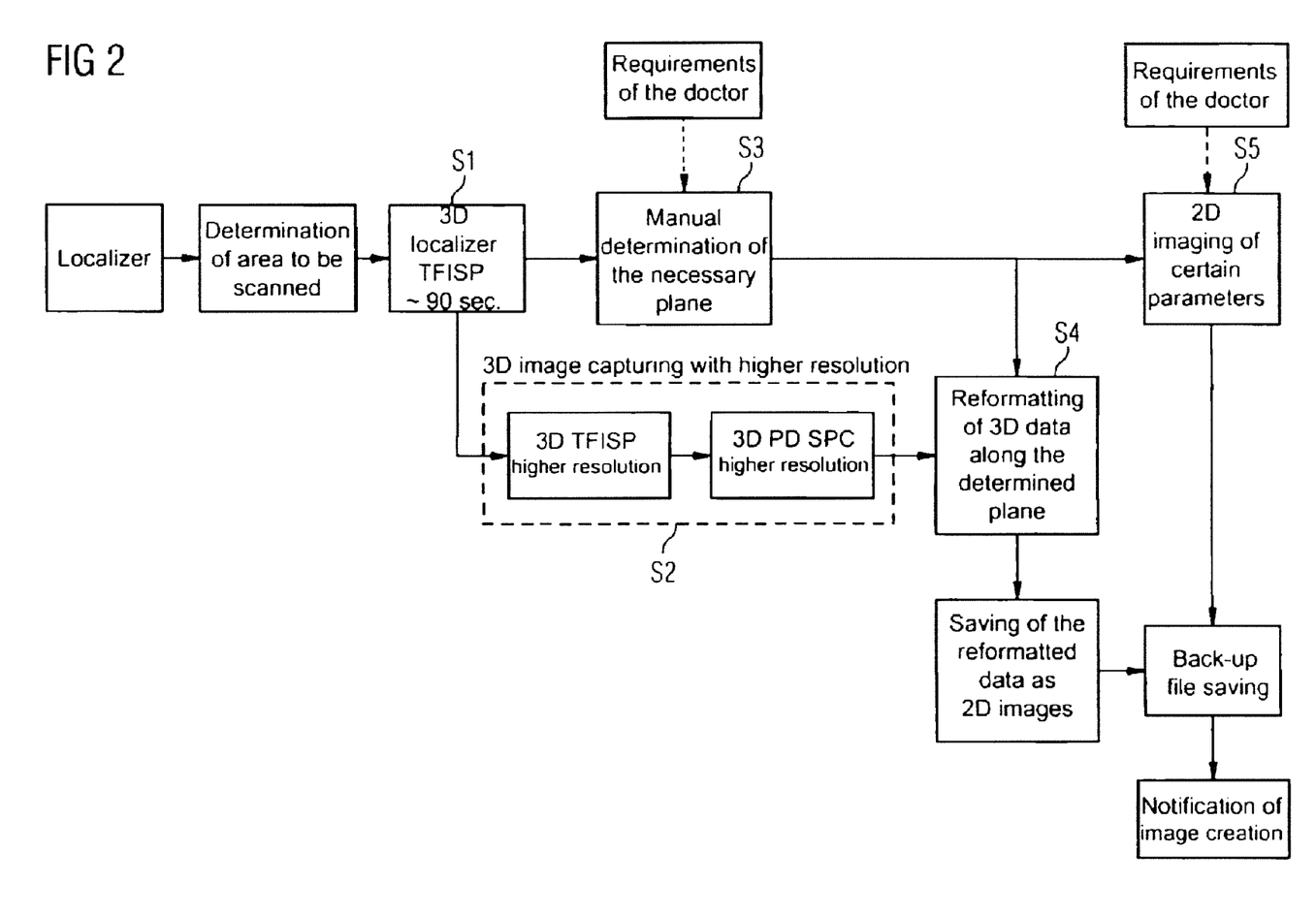
FIG. 2 shows an orthopedic procedure, with the method in accordance with the invention, embedded therein, whereby the necessary layers are determined manually.

FIG. 2 shows an orthopedic procedure, which implements one design version of the process of the invention. This procedure will be explained in detail in the following.

First, an area is determined by a localizer, in which an orthopedic region to be examined is located. This localizer is understood to be a tool that examines the inside of a body, and can determine a specific region or specific area therein.

In a first step S1, a first three-dimensional MR image data set of the predetermined area or region is produced using a three-dimensional localizer. TFSIP is used in the production of the first three-dimensional MR image data set. TFSIP stands thereby for "True FSIP" and FSIP stands for "Fast Imaging with Steady State Precession." A period of approximately 90 seconds is required for producing the first three-dimensional MR image data set. In other words, in this step S1, a three-dimensional MR image data set with an isotropic resolution will be produced of the entire predetermined region, e.g. a knee joint.

Next, in a second step S2, a second three-dimensional MR image data set is produced, with a higher resolution than that of the first three-dimensional MR image data set. The production of this second three-dimensional MR image data set is carried out using TFSIP and/or PD SPC.

In parallel with the second step S2, in a third step S3, a manual planning out or determination of the necessary planes or layers is carried out for the two-dimensional MR images to be produced later. In this manual planning out or determination, requirements of an operator, e.g. a doctor, will be taken into account. The resolution selected in the first step S1 corresponds thereby to a resolution which allows for a good quality in planning out the layers. Because the planning out is made with a three-dimensional image data set, it is also easy, in contrast to the present state of technology, to plan for layers which are at an angle to the sagittal, coronal and transversal planes, in order to determine a layer, for example, whereby a cruciate ligament is scanned in an optimal manner.

In an examination of a knee joint, five layers, for example, may be planned on for imaging the meniscus, ten layers for imaging the cruciate ligaments and four layers for imaging the cartilage surfaces of the patella.

In a fourth step S4, two-dimensional MR images are produced in each case for the layers planned out based on the three-dimensional MR image data set produced in the second step S2. For this, the image points lying in each planned layer or plane are computed from the second three-dimensional MR image data set for each planned out layer or plane, and thereby a two-dimensional MR image is generated corresponding to the layer, which corresponds to a two-dimensional MR image that would be recorded using a conventional image producing process by means of the magnetic resonance imaging scanner within the relevant layer. After the two-dimensional MR images have been produced or reformatted from the three-dimensional MR image data set produced in the second step S2, these reformatted data or two-dimensional MR images are saved for further use.

In a fifth step S5, two-dimensional MR images to be used in the layers planned out in the third step S3 are produced with the magnetic resonance imaging scanner, whereby certain MR aspects, such as T1 time, T2 time, T2* time, and/or diffusion constants, are measured within the relevant layers and presented graphically. The production of these two-dimensional MR images in the fifth step S5 is carried out based on requirements of an operator or doctor. The MR images produced in the third step may be made in layers for which MR images will be generated in the fourth step. It is also possible however, in accordance with the invention, that these concern different layers.

Both the two-dimensional MR images produced in the fifth step S5 and the two-dimensional MR images produced and stored in the fourth step S4 will be saved in a back-up file. After all of the two-dimensional MR images have been saved, a notification is given indicating that the imaging of the two-dimensional MR images is complete.

Figure 3:
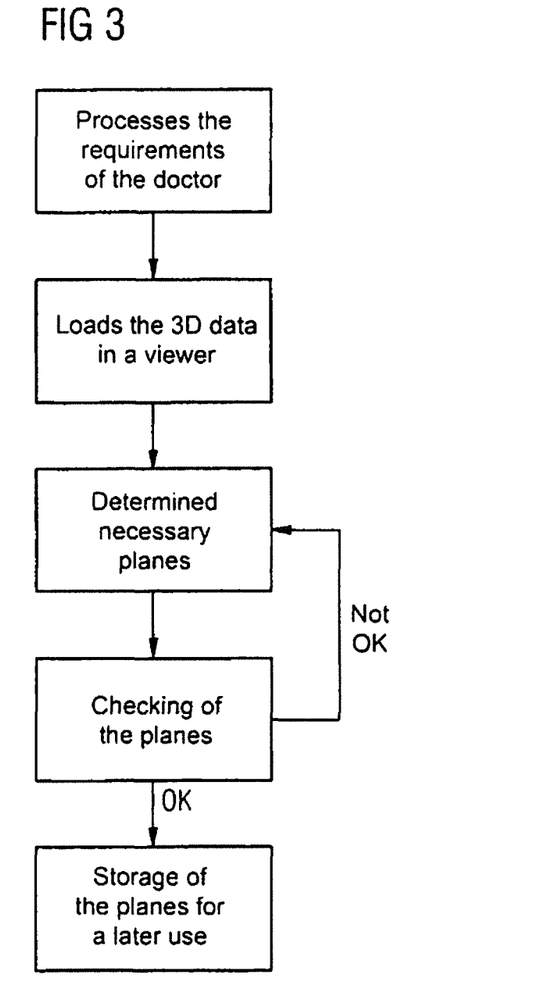
FIG. 3 illustrates in detail a manual determination of the necessary layers for the orthopedic procedure shown in FIG. 2.

FIG. 3 shows in detail how the manual determination of the necessary layers or planes is carried out for the orthopedic procedure shown in FIG. 2, taking place for the most part in the third step S3.

Taking into account certain requirements of an operator or doctor, the lower resolution three-dimensional images (see step S1 in FIG. 2) are loaded in a device whereby these three-dimensional images can be displayed in order that the operator can see specific parts of the area in question that have been imaged in the three-dimensional image data set. The operator plans out or determines thereby the necessary planes or layers for the orthopedic procedure. For each step, the operator must confirm whether or not he is in agreement with the respective planned layer. If a confirmation is given (OK), then the relevant layer is saved, particularly for producing the two-dimensional MR images in step S4. If a confirmation is not given (not OK) then the relevant layer must be re-planned or determined anew.

Figure 4:
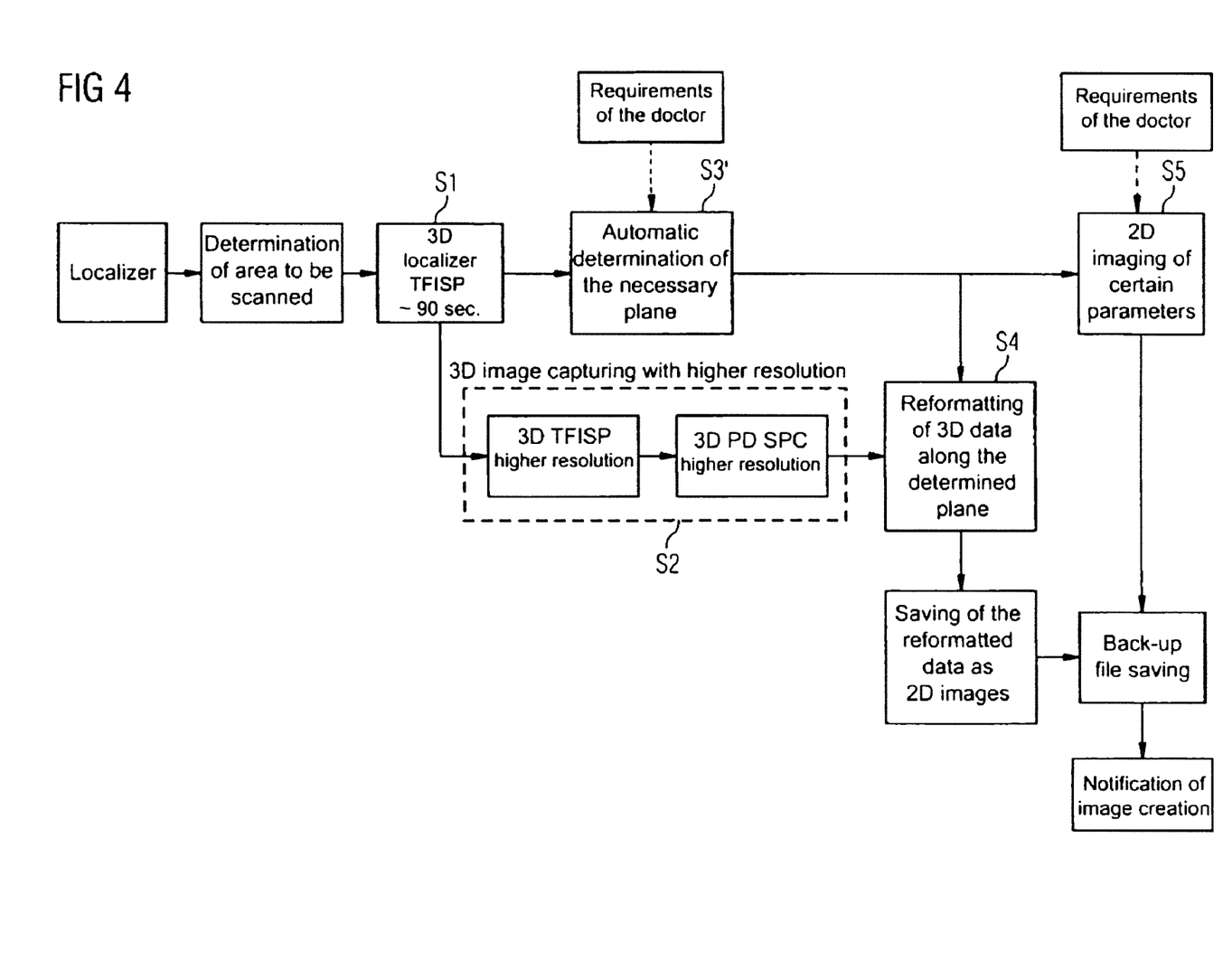
FIG. 4 shows an orthopedic procedure, with the process, in accordance with the invention, embedded therein, whereby the necessary layers are automatically determined.

FIG. 4 shows an orthopedic procedure in which the necessary layers or planes are determined automatically, rather than manually. The orthopedic procedure in FIG. 4 corresponds to the orthopedic procedure shown in FIG. 2, with the exception of the establishing or planning out of the necessary layers, and therefore in the following, only the automatic planning or determining of the necessary layers will be described, and for the rest of the orthopedic procedure shown in FIG. 4, the execution with respect to FIG. 2 is to be referred to.

The basis for the automatic determination of the necessary layers is the same as that for the orthopedic procedure for the three-dimensional MR image data set of a lower resolution produced in the first step S1 in FIG. 2. In this case, the resolution is selected such that the following automatic determination of layers and particularly the pattern recognition algorithm may function in the most optimal manner possible. In the three-dimensional MR image data set produced in step S1, a given characteristic or pattern, such as a meniscus or a ligament, provided by an operator or doctor, is located automatically in the third step S3'. When an appropriate pattern recognition algorithm has found the given characteristic or pattern, the necessary layers, taking into account further requirements of the operator, will be automatically determined. The appropriate planning algorithm recognizes furthermore, for example, the location of all potential necessary layers in relation to the location or orientation of the given pattern, and can therefore determine the necessary layers, when the spatial orientation of the given pattern (meniscus or cruciate ligament) has been established in advance.

Figure 5:
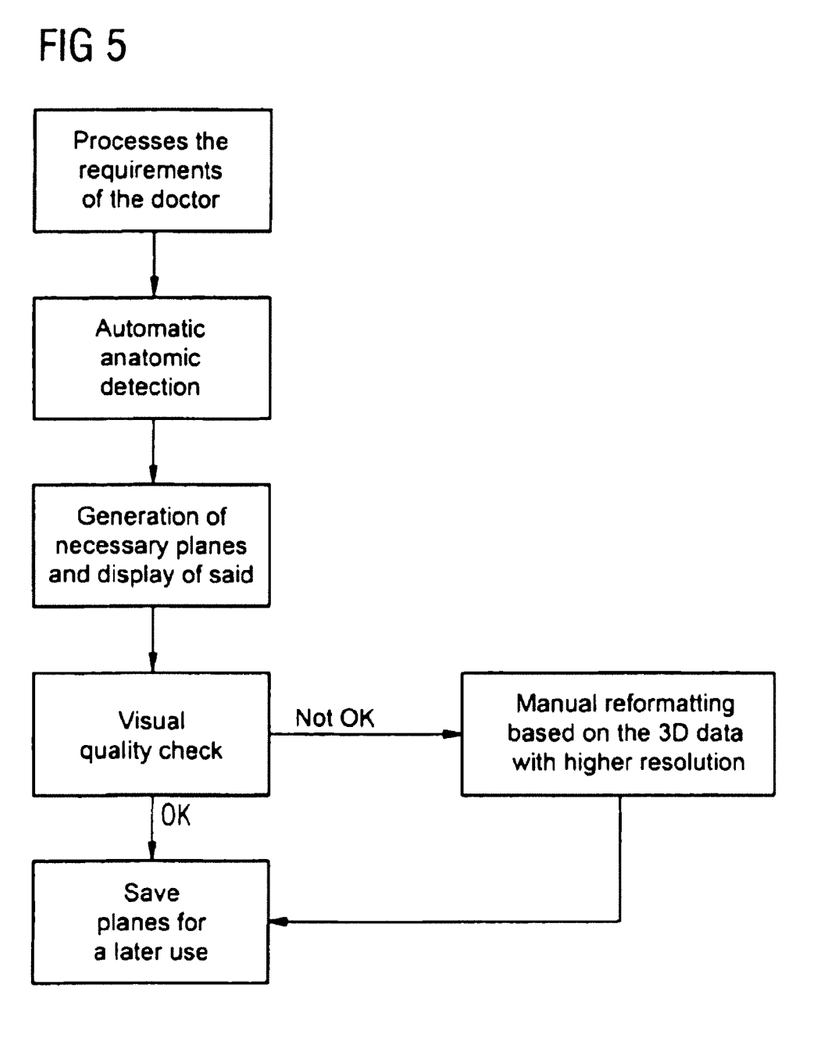
FIG. 5 shows in detail an automatic determination of the necessary layers for the orthopedic procedure shown in FIG. 4.

The automatic planning of the necessary layers is shown and explained in FIG. 5 in detail.

Taking into account requirements of an operator or a physician, certain patterns in the lower resolution three-dimensional MR image data set are captured and, based on this, the necessary layers are established. Each of these layers is subsequently presented to the operator, and submitted to a quality check by said. When the visual quality check is accepted, the respective layer is saved for later use, particularly for producing two-dimensional MR images (step S4) based on the higher resolution three-dimensional MR image data set. When the visual quality check does not meet its requirements, a manual reformatting of re-planning is carried out on the basis of a higher resolution three-dimensional image data set in order to determine the respective layer, which is then saved for further use.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for producing at least one two-dimensional magnetic resonance (MR) image, comprising the steps of:
   operating a magnetic resonance data acquisition unit to acquire a first three-dimensional MR image data set of a predetermined region of a subject, with a first resolution;
   operating said magnetic resonance data acquisition unit to acquire a second three-dimensional MR image data set of said predetermined region, with a second resolution that is higher than said first resolution;
   in a processor, using said first three-dimensional MR image data set to determine at least one layer of the subject for which at least one two-dimensional MR image is generated; and
   in said processor, automatically generating said at least one two-dimensional MR image of said layer from said second MR image data set, and making said at least one two-dimensional MR image available as a data file at an output of said processor.

2. A method as claimed in claim 1 comprising simultaneously determining said layer and acquiring said second three-dimensional MR image data set.

3. A method as claimed in claim 1 comprising planning acquisition of said first three-dimensional MR image data set using a computerized control unit for said data acquisition unit and, in said computerized control unit, automatically determining characteristics of an area within said predetermined region.

4. A method as claimed in claim 3 comprising selecting said characteristics from the group consisting of T1 time, T2 time, T2* time, and a diffusion constant of at least one substance in said area.

5. A method as claimed in claim 1 comprising setting said resolution of said first three-dimensional MR image data set to be substantially equal in each of said three dimensions.

6. A method as claimed in claim 1 comprising setting said resolution of said second three-dimensional MR image data set to be substantially equal in each of said three dimensions.

7. A method as claimed in claim 1 comprising automatically determining said at least one layer of said two-dimensional MR image using said first three-dimensional MR image data set by localizing a predetermined anatomical orientation point in said first three-dimensional MR image data set and determining said layer dependent on said anatomical orientation point.

8. A method as claimed in claim 1 comprising acquiring said first and second three-dimensional image data sets of a joint of the subject, as said predetermined region.

9. A magnetic resonance imaging apparatus for producing at least one two-dimensional magnetic resonance (MR) image, comprising:
   a magnetic resonance data acquisition unit operated by a control unit;
   said control unit being configured to operate said magnetic resonance data acquisition unit to acquire a first three-dimensional MR image data set of a predetermined region of a subject, with a first resolution;
   said control unit being configured to operate said magnetic data acquisition unit to acquire a second three-dimensional MR image data set of said predetermined region, with a second resolution that is higher than said first resolution;
   a processor configured to use said first three-dimensional image data set to determine at least one layer for which at least one two-dimensional MR image using to be generated; and
   an image computer configured to automatically generate said at least one two-dimensional MR image of said layer from said second MR image data set, and to make said at least one two-dimensional MR image available as a data file at an output of said processor.

10. An apparatus as claimed in claim 9 wherein said control unit and said processor are configured to simultaneously determine said layer and acquire said second three-dimensional MR image data set.

11. An apparatus as claimed in claim 9 wherein said control unit is configured to plan acquisition of said first three-dimensional MR image data set using entries into said control unit from which said control unit is configured to determine characteristics of an area within said predetermined region.

12. An apparatus as claimed in claim 11 wherein said control unit is configured to determine said characteristics from the group consisting of T1 time, T2 time, T2* time, and a diffusion constant of at least one substance in said area.

13. An apparatus as claimed in claim 9 wherein said control unit is configured to set said resolution of said first three-dimensional MR image data set to be substantially equal in each of said three dimensions.

14. An apparatus as claimed in claim 9 wherein said control unit is configured to set said resolution of said second three-dimensional MR image data set to be substantially equal in each of said three dimensions.

15. An apparatus as claimed in claim 9 wherein said processor is configured to automatically determine said at least one layer of said two-dimensional MR image using said first three-dimensional MR image data set by localizing a predetermined anatomical orientation point in said first three-dimensional MR image data set and to determine said layer dependent on said anatomical orientation point.

16. An apparatus as claimed in claim 9 wherein said data acquisition unit is configured to acquire said first and second three-dimensional image data sets of a joint of the subject, as said predetermined region.

17. A non-transitory, computer-readable storage medium encoded with programming instructions, said medium being loadable into a computer system of a magnetic resonance imaging apparatus, having a data acquisition unit, said programming instructions causing said computer system to:
   operate said magnetic resonance data acquisition unit to acquire a first three-dimensional MR image data set of a predetermined region of a subject, with a first resolution;
   operate said magnetic data acquisition unit to acquire a second three-dimensional MR image data set of said predetermined region, with a second resolution that is higher than said first resolution;
   use said first three-dimensional MR image to determine at least one layer for which at least one two-dimensional MR image is to be generated; and
   generate said at least one two-dimensional MR image of said layer from said second MR image data set, and make said at least one two-dimensional MR image available as a data file at an output of said processor.

18. A method as claimed in claim 1 comprising providing said data file from said processor to a display unit and, at said display unit, displaying a visual representation of said at least one two-dimensional MR image.

19. An apparatus as claimed in claim 9 comprising a display unit in communication with said image computer, said image computer being configured to provide said data file to said display unit and to cause said display unit to display a visual representation of said at least one two-dimensional MR image.

* * * * *